United States Patent [19]
Brandes et al.

[11] Patent Number: 5,395,738
[45] Date of Patent: Mar. 7, 1995

[54] ELECTRON LITHOGRAPHY USING A PHOTOCATHODE

[76] Inventors: George R. Brandes, 124 Coalpit Hill Rd., Danbury, Conn. 06810; Philip M. Platzman, 80 Addison Dr., Short Hills, N.J. 07078

[21] Appl. No.: 997,817

[22] Filed: Dec. 29, 1992

[51] Int. Cl.[6] ............................................. F03C 5/00
[52] U.S. Cl. ................................. 430/296; 430/942; 437/935
[58] Field of Search ................. 430/296, 942; 437/935

[56] References Cited

U.S. PATENT DOCUMENTS

| | | | |
|---|---|---|---|
| 3,806,756 | 4/1974 | Low et al. | 315/10 |
| 4,350,919 | 9/1982 | Johnson et al. | 250/214 VT |
| 4,746,587 | 5/1988 | Nicholas | 430/296 |
| 5,156,942 | 10/1992 | Aton et al. | 430/296 |

OTHER PUBLICATIONS

T. W. P. Chang et al., "Electron–Beam Lithography Draws a Finer Line", *Electronics*, May 12, 1977, pp. 89–98.

J. E. Bjorkholm et al, *J. Vac. Sci. Technology*, v. B8, p. 1509 (1990).

*E-beam Technology*, Brewer, ed., chap. by J. Trotel and B. Fay, pp. 325–335 (1980).

S. D. Berger, et al., *J. Vac. Sci. Technology*, v. B9(6), p. 2996 (1991).

G. K. Celler et al, *Applied Physics Letters*, v. 59, 3105 (1991).

*IEEE Transactions on Electron Devices*, v. ED-22, No. 7 (Jul. 1975).

*J. Vac. Sci. Technology*, v. B4(1), pp. 89–93 (Jan./Feb. 1986).

*Primary Examiner*—Charles L. Bowers, Jr.
*Assistant Examiner*—J. Pasterczyk

[57] ABSTRACT

Sub-micron pattern delineation, importantly in the fabrication of large scale integrated devices, is based on a patterned photocathode. Functionally, the photocathode plays the role of the mask in competing systems, either in proximity printing or in projection. In operation, the photocathode is illuminated by ultraviolet radiation to release electrons which are brought to focus on a resist-coated wafer with assistance of a uniform magnetic field together with an accelerating applied voltage.

16 Claims, 3 Drawing Sheets

ELECTRON LITHOGRAPHY USING A PHOTOCATHODE

BACKGROUND OF THE INVENTION

1. Technical Field

The field addressed concerns sub-micron imaging—imaging based on least dimensions of less than 0.3 μm. A primary objective is lithographic imaging in the fabrication of Large Scale Integrated circuits (LSI).

Processes of the invention depend upon excitation of electrons from a patterned photocathode by use of electromagnetic radiation—generally radiation in the ultraviolet spectrum (of energies greater than 5 eV).

2. Description of the Prior Art

It is widely recognized that continuing miniaturization of LSI from presently used 1.0–0.9 design rules will soon require a different approach to pattern delineation. Presently used radiation in the near-UV spectrum (λ=0.4–0.5 μm) is considered wavelength-limiting. As now practiced, it is the general view that deep-UV will be substituted, in turn to be limiting at =0.25 μm design rule.

Considerable work is directed to extension of UV to design rules thought too small by the conventional view. Progress has been made on development and use of phase masks. The principle is phase cancellation of edge-scattered radiation. Development of this approach is now at an advanced level to accommodate variation in reference phase, e.g. due to proximity effects for closely spaced features, while continuing to produce the 180° phase shift. It is expected that use of phase masking will permit extension to design rules perhaps half as great as the assumed wavelength limit.

The realization that a different form of radiation will be required for succeeding LSI generations—likely at the 256 mbit chip level—is responsible for a high level of activity worldwide.

World activity for the most part entails use of electromagnetic radiation of shorter wavelength—of soft x-ray. X-ray projection has proceeded apace with experimental systems producing satisfactory 0.1 μm patterns (see, J. E. Bjorkholm, et al, *J. Vac. Sci. Tech.*, v. B8, p. 1509 (1990)).

Electron imaging has not been overlooked. Evolution of a mask projection system gained from experience in the direct write Electron Beam Exposure System (see, "E-beam Technology", Brewer, ed., chapter by J. Trotel and B. Fay, pp. 325–335 (1980). Scattering with Angular Limitation Projection Electron-beam Lithography has been demonstrated in the form of reduction projection to yield a 0.1 μm design rule pattern. (See S. D. Berger et al. *J. Vac. Sci. Technol.*, B9 (6), p. 2996 (1991).)

Despite the obvious advantages of reduction projection—regarding cost and fabrication of the mask—considerable effort is directed to 1:1 x-ray imaging (see, G. K. Celler, et al, *App. Phys. Lett.*, v. 59, p. 3105 (1991)). There are many who believe that increased mask cost associated with 1:1 is offset by design simplification and reduced apparatus cost relative to reduction projection. Experimental systems have demonstrated feasibility of mask construction and of proximity printing at 0.2 μm design rule and smaller. Some believe that this approach will be only a last resort. Mask fragility, always an issue, is aggravated by the very close proximity required between mask and wafer. A major field of endeavor is directed to mask repair. The x-ray source continues to be a problem—for the most part effort is based on a synchrotron source, likely at a cost of at least ten million dollars.

A now-abandoned effort of some years ago was based on use of a photocathode. In its most advanced form, the photocathode, in replacing the mask, was constituted of a UV-transparent substrate, typically quartz, having one surface coated by a patterned layer of a good photo emitter, for example, cesium iodide, CsI. The "blocking" regions were constituted of a poor photo-emitting material, typically chromium (see, *J. Vac. Sci. Technol.* cited above). The structure was operated by illuminating the back surface with UV radiation (see, Trotel and Fay cited above).

Abandonment must be attributed to a number of drawbacks, some regarded as inherent, some perhaps due to limitations in then-available conditions and materials. For one thing the photocathode itself was regarded as short-lived—as needing frequent replacement. Recognizing that short life was likely due to contamination—to reaction despite use of the best vacuum practically available—an effort was apparently made to seek out less reactive material. Trotel and Fay at page 330 report the use of a noble metal—specifically of gold. The photocathode took the form of a very thin layer—of a 50 Å thick layer—to optimize needed surface emission from the highly absorbing gold layer. The effort was unsuccessful—the cathode did not last long in operation and the approach was abandoned.

Problems associated with design of the photocathode projection system are discussed in *IEEE Transactions on Electron Devices*, vol. ED-22, No. 7, (July 1975). First characterizing such systems as having excessive image distortion, the author goes on to reach the conclusion that structural elevational differences on the anode—on the image plane—may be significant. Numerically, the conclusion is reached that achievement of ±0.3 μm accuracy requires anode flatness of ±2 μm. Attainment of smaller design rule patterns would presumably require greater flatness.

A more recent article, *J. Vac. Sci. Technol.*, B4(1), pp. 89–93, (Jan/Feb 1986), addresses future needs. On the assumption that pattern area will be limiting, the authors first dismiss x-ray alignment registration marks as inadequate—presumably as unduly space consuming—and then suggest a step-and-repeat system depending on back-scatter alignment marks. Acknowledging that the detection system will not function in the presence of the high electric field required for resolution (for sufficiently short deBroglie wavelength), provision is made for a field-free region. Field-elimination is the consequence of a movable grid placed at the first magnetic focus point—at the distance corresponding with the first 360° cyclotron period. Of course, the presence of the grid, while of minimal consequence as so positioned, continues to be an impediment and, in turn, requires significant apparatus/process complexity to avoid distortion of the image by the grid.

SUMMARY OF THE INVENTION

A photocathode projection system and its use in formation of submicron images is described. The system may serve a number of objectives. It may serve as a simple display. Use may be based on electron enhancing or discouraging, e.g. to result in selective crystal growth as based on electron stimulated desorption. Most significant near-term use is expected to take the form of submicron device fabrication based on resist-patterning by the photocathode. While, as discussed in the Detailed Description, the system may be based on reduction projection from a large cathode pattern, first commercial use will likely be 1:1. The following description for convenience is, unless otherwise stated, in terms of 1:1 device fabrication entailing projection on an electron-sensitive resist-coated wafer.

Implicit characteristics of such a system are retained. The cathode structure consists of a patterned coating of photoemissive material on a UV-transparent substrate. An inherent advantage is the good thermal conductivity of the relatively thick cathode structure. Thermal expansion problems with masks used in transmission systems—both x-ray and electron—are lessened. The back surface of the substrate is irradiated by UV to emit imaged electrons from the patterned coating. Electrons are accelerated by an electric field in the direction of an anode which may be at the image plane or beyond. A uniform magnetic field between the photocathode and the image plane, together with such a parallel electric accelerating field, results in cyclotron focusing on the image plane. Cathode-to-image separation of from millimeters to centimeters corresponds with one or a few cyclotron resonance periods from the emissive surface to the image plane.

Avoidance of the high space charge regions produced at cross-over in conventional focusing systems permits operation in two regimes. In the high voltage regime, e.g. 25 kV and above—25 kV/cm for the centimeter order of cathode-to-wafer spacing contemplated—blurring due to random electron motion in the resist is minimized. In the low voltage regime, e.g. two or a few kV—defined as the range over which most of the electrons are absorbed within the resist—so that few reach the substrate—blurring due to back-scatter of electrons from the substrate is avoided. Choice of field values intermediate the two regimes may be appropriate.

The acknowledged prior art deficiency—short-lived photocathodes—is addressed. It is agreed that a significant part of the problem is "contamination," and that maintenance of an appropriate vacuum level is difficult, if only because of liberation of hydrocarbons or other contaminant from the resist-coated wafer. Consistent with an earlier approach, photocathodes of the invention are of noble metal. Use of such low efficiency photoemitters requires activation with photon energies significantly above the metal work function to, in turn, result in a large energy spread for emitted electrons. Availability of large homogeneous magnetic fields, as resulting from use of superconducting wire turns lessens the effect of the energy spread. Cause of earlier failure of noble metal cathodes by prior art workers has not been identified. Experimentally, success has been realized with layer thicknesses of 100 Å and greater, together with appropriate underlying material to assure adhesion of the film. It is possible that earlier failures were due to discontinuities in the thinner (50 Å) films reported.

The concern with wafer smoothness by prior workers appears unfounded. To some extent this may also be attributed to the rather low magnetic field intensities (less than 1 tesla) used for focusing in the past. In any event, there is no such problem with magnetic focusing fields of from 2 to 10 tesla. Surface roughness of off-the-shelf silicon wafers with local elevation variations of 1 μm has no perceptible effect on resolution.

A significant advantage of electron delineation is the inherent ability to magnetically vary focal distance. An inventive species takes advantage of this by providing for an adjusting field. The large fields for fundamental focusing generally depend on superconducting magnets. Easily controlled conventional solenoids at or near the focal plane may be used for fine focusing. A symmetrically shaped field may be used for radially dependent aberrations. Local perturbations in field strength as well as elevational changes on the surface to be imaged as caused by prior processing of the wafer, may be addressed by independently controlled, small solenoids.

Charged particle delineation permits enlargement or reduction of the projected image by adjustment of magnetic field intensity. While initial use is expected to be 1:1, future use may incorporate reduction from a 4x-5x mask in the manner of x-ray and e-beam projection systems. This may be accomplished by increasing field density in the direction from the photoemitter to the wafer. Field compression to result in this image-reducing "funnel" is particularly valuable for use with the photocathode of the invention, but it may be applied more generally. It may even be reversed in direction to enlarge the image.

X-ray stimulated fluorescent markings may provide both for registration of succeeding processing steps, as usual in LSI manufacture, and for registration of successive regions in step-and-repeat. X-ray is unaffected by the accelerating electric field (the E-field) and so avoids need for a null-field region for this purpose. An alternative alignment mechanism depends on electron emission from alignment paths on the photocathode. Pads may be at corner positions and may generate characteristic x-ray from correspondingly placed metal markers on the wafer. Proper selection of metal composition differing from materials used in the device under construction avoids confusion with any spurious emission.

DETAILED DESCRIPTION

General

Figure 1:
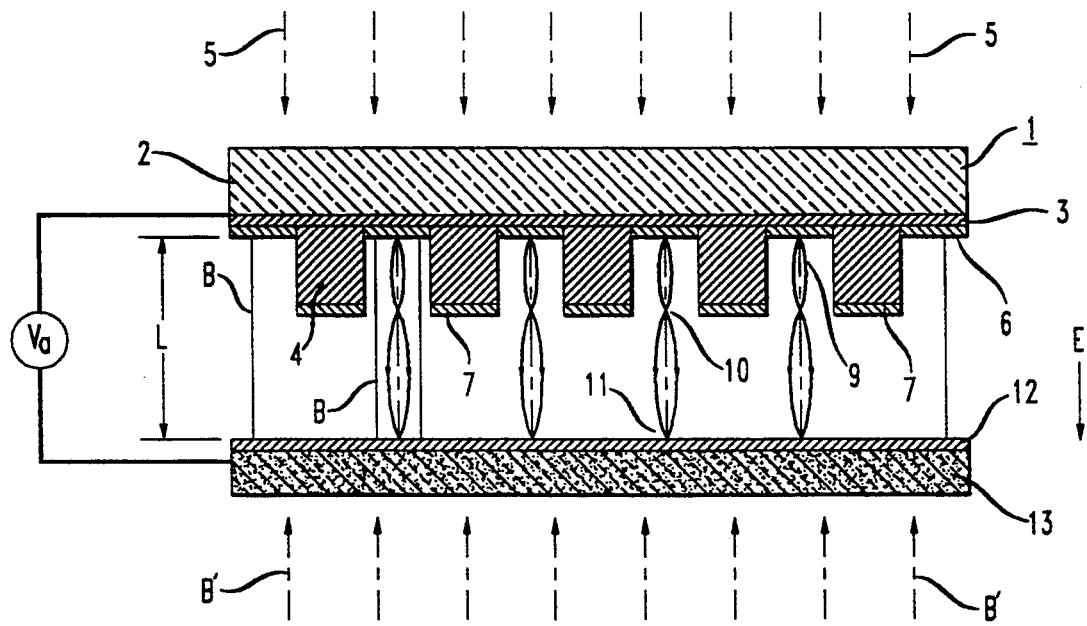
FIG. 1 is a diagrammatic view depicting a cathode structure of the invention with provision for activation, electron emission, and cyclotron focusing. The cathode structure shown is patterned by UV-blocking regions below an overall emitting surface. It is an example of a "thick-thin" cathode.

The essence of the invention has been described in the preceding sections. Claims are directed to a process which does not show earlier difficulties in photocathode patterning. Cathode structures and operating parameters avoid critical dependence on surface roughness and other imperfections. Multi-level processing and step-and-repeat, as well as continuous scanning, is expedited by use of the x-ray-excited fiducial markings described. Optimal resolution may be assured by "fine tuning" of magnetic field, preferably by use of a superimposed smaller field which may even be shaped to rectify local as well as systematic aberrations.

Available materials and procedures are adequate for described mask structures. The EBES direct write system, in worldwide use for mask fabrication, may be directly applied. Resist patterns, once defined and developed in usual fashion, are then used in fabrication of the photocathode. Deposition methods for contemplated mask materials are well-known.

Cathode Structure/Materials

Inventive structures rely upon use of noble metal photoemitters. Contemplated materials are elemental or alloyed. While the inventive teaching may be found useful for other types of materials, experimental support dictates exclusive use of elements numbers 44–47 and 75–79 of the Periodic Table according to Mendeleev, i.e. Ru, Rh, Pd, Ag, Re, Os, It, Pt, Au, as well as alloys of such elements. Selection is dictated by a variety of considerations. One is ease of formation—of formation likely of a thin layer atop a transparent substrate. Still another concerns reactivity—on the basis of which Au is to be preferred over Ag, etc. Another relates to work function. So, for example, Au with its work function of $\approx 5.1$ eV (for its most favorable crystal plane) is, from this standpoint, preferred over Pt with its work function of 5.65 or 5.7 eV. An initial advantage of Au is permitted use of Pt masking with excitation intermediate the work functions of Au and Pt. As a rule of thumb, the number of exiting electrons is proportional to the square of the difference in energy between the work function and central frequency of the exciting source expressed as a percentage. Use of gold, with its lower work function, may result in a narrower energy spectrum for emitted electrons.

Gold emitter material, however, may not be preferred for practical reasons. Gold contamination of silicon may preclude fabrication of silicon devices. Platinum, despite its other disadvantages, for this reason may be preferred. Example 1 uses a Pt photocathode.

Photoemitting materials used have short penetration depths for exciting energy. The noble metals have short UV penetration depths. Emission probability requires electron generation close to the emitting surface. Practical considerations suggest thick layers. Most effective emission is a compromise between layer continuity and penetration depth. Experimental work supports a specified layer thickness range of from one hundred Å to several hundred Å–to 500 Å or greater. Still greater thickness is operative but inefficient.

FIG. 1 shows a "thick-thin" structure, 1. It is fabricated by depositing emitting material on the front surface of the cathode. Emission in blocking regions is prevented by underlying material which absorbs and/or reflects exciting radiation. Structure 1 consists of a substrate 2, which in the instance of an example, is constituted of sapphire. More generally, the substrate material is chosen for performance properties including transparency to the exciting radiation durability to withstand handling, and thermal conductivity to avoid thermal stress. The sapphire substrate is coated with a thin—e.g. a 100 Å—"glue" layer 3. Use of chromium assures adherence and continuity of subsequent layered material.

It is found that adhesion is assured by use of "glue" metals that form oxides with a heat of formation greater than that of $SiO_2$. Examples are Al, Ti, Ta, Cr. Ti, a particularly good adhesion promoter reduces $SiO_2$ at relatively low temperature and forms a strong bond. Metals such as Au, Pt, W and Mo do not reduce $SiO_2$ but form oxides with lower heat of formation than $SiO_2$. These metals have poor adhesion to $SiO_2$ and benefit by a "glue" layer. The structure shown is fabricated by first coating the entirety of "glue" layer 3 with a layer of blocking material 4 which is subsequently pattern delineated to leave residual regions of material 4. Regions, 4, serve to extinguish—to absorb and/or to reflect—exciting radiation 5 and prevent excitation of overlying photoemissive material. The photoemissive material is deposited after pattern delineation to result in regions 6 and 7. In one example, gold serves as the material of regions 6 and 7. Thickness of such regions is generally at least 100 Å, e.g. 250 Å. In one example, blocking material is tungsten. A 700 Å tungsten layer is sufficient to prevent significant photoemission from regions 7. The blocking material is chosen with attention to requisite adhesion to underlying surface—to "glue" layer 3—and to requisite adhesion for overlying surface—for emissive material 7.

An alternative structure, is based on use of a continuous layer of photoemissive material, with blocking regions serving to prevent emission from uniformly irradiated emissive material. Deposited regions of non-emissive material on the front face of the emitting surface serve to pattern emission. Since blocking material may be of thickness comparable to that of the emitter layer, such structures are here referred to as "thin-thin." FIG. 2 illustrates such a structure.

Figure 2:
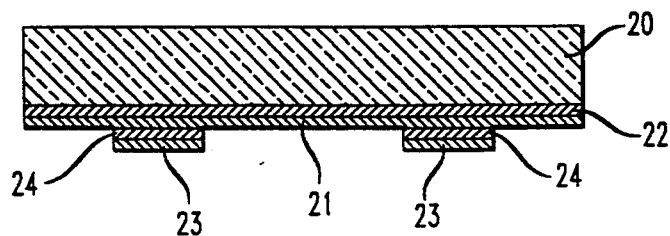
FIG. 2 depicts an alternative structure—a "thin-thin" cathode. Here, photoemission is patterned by surface blocking regions of increased work function.

The structure of FIG. 2 includes a transparent substrate 20 which, as in FIG. 1, may be sapphire. Emission is from exposed regions of layer 21, a noble metal layer of thickness satisfying criteria set forth—assuring absorption of exciting energy near the emitting surface and to reliably result in a void-free (a continuous) layer. It has been found extremely helpful, in the instance of gold photoemitter, to include a "glue" layer 22. A 100 Å thick layer of chromium has been found effective for use with a 250 Å layer 21 of gold. Blocking regions 23, of higher work function material, serve to pattern delineate. 100 Å thick Pt, over "glue" layer 24, —e.g. over a 100 Å thick Cr layer, is effective. Generally, while omission of the "glue" layer may not preclude a continuous adherent layer of emissive material, structural integrity, particularly for gold, is best assured by its use.

Figure 3:
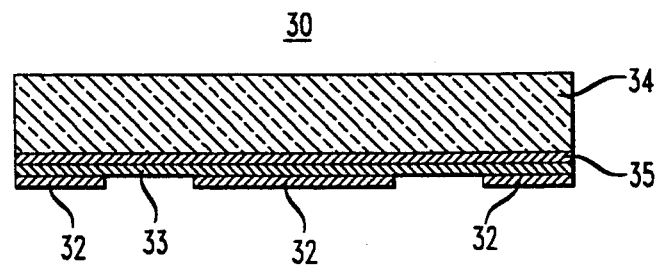
FIG. 3 shows yet another different form of structure in which the photoemitting material is, itself, patterned, with bared regions exposing underlying non-emitting material. Reference is made to the drawing in discussion both of cathode structures/materials and of processing.

The structure of FIG. 3 is based on a photoemissive layer 32 which is etch-delineated to reveal regions of underlying non-emitting layer 33. Layer 33 is bonded to substrate 34 by means of "glue" layer 35. The material of layers 32–35 may be gold, platinum, quartz and chromium, respectively.

Photoemission, in accordance with the invention, is the exclusive province of noble metal/s. Reference to "noble metal" cathode, etc., however, is not intended to restrict the emitting surface to one consisting exclusively of noble metal/s. The emitting material may be admixed to produce either a homogeneous or inhomogeneous surface. Any such additional material should not "contaminate" or in any way impair emission efficiency.

Processing Conditions

Reference is made to FIG. 1 for description of operation. Irradiation 5 peaks at a photon energy to excite the photoemitter. Effective emission requires photon energy in excess of the work function of the emitter—excess of a minimum of perhaps 10%. At the same time it must not be so large as to cause significant emission from regions to be blocked. The thick-thin structure of FIG. 1 satisfies this need simply by adequate extinction of ultraviolet. The criteria are primarily those of material properties and thickness of the blocking layer. Provision of surface blocking regions to prevent electron emission from uniformly excited emissive material, as in the thin-thin structure of FIG. 2, is again subject to material and thickness criteria. Other structures may provide for uniform excitation of otherwise unblocked regions of exposed material—of emissive, and of non-emissive material. Under these circumstances, criteria are simply those of the relative work functions of regions constituting emitting and non-emitting portions of the cathode.

Excitation radiation may be passed through a filter to assure a reasonably narrow energy spread of emitted electrons, e.g. $\pm 10\%$. While the use of a large accelerating field lessens the effect, a spread in electron energies, as emitted, e.g., corresponding with a spread in photon energies, results in a spread in focal distance. A krypton lamp operating at a peak of 6.5 eV is effective in exciting Pt with its 5.6 eV work function. Alternative sources are deuterium lamps peaking at 7 eV and mercury lamps peaking at 6 eV. All are examples of high pressure lamps operating as plasma discharge tubes.

For an appropriate excitation source, the energy spread of electrons 9 permits good resolution upon imposition of magnetic field B to bring these electrons to focus periodically as at node 10 or 11. The B field is uniform across the effective electron emission cross-section—across an area at least as large as the region to be patterned on layer 12. B fields, to several tesla in intensity, are conveniently produced by use of a superconducting magnet. Superconducting solenoids to yield uniformity of better than 1% over a volume of 1,000 $cm^3$ are easily sufficient for contemplated image areas of a few $cm^2$. The image plane is here shown as corresponding with the surface of a resist layer 12 on top of silicon wafer 13. In such instance, the well-known positive-tone resist, PMMA, is usefully employed. Alternatives including the negative tone resist, COP, may be used. An electrical field, E, produced by voltage source $V_a$ accelerates the electrons 9 to the desired velocity. The magnitude of the accelerating voltages is a compromise between line resolution in the resist and smearing due to back-scattering from the underlying substrate. Lower voltages minimize back-scattering. Higher voltages minimize image smearing in the resist, but at the same time reduce absorption by the resist to produce more back-scattering from the substrate. Choice for optimum resolution/contrast may depend on the nature of the pattern. As an example, contrast loss due to back-scattering is aggravated by large, closely spaced features. Voltages from 2 kV–100 kV have been found useful under experimental conditions set forth in the Examples.

FIG. 1 includes a diagrammatic representation of magnetic field B'. Such an optional adjusting field may correct for aberrations in the intensity of the magnetic field B, either regular or irregular, across the imaging surface of layer 12. As discussed, this adjusting field, likely to be of maximum value of 2 kilogauss and of either polarity, is conveniently produced by one or more conventional wirewound solenoids below wafer 13. Regular deviation from uniformity of the B field may be compensated by a single-shaped field, possibly produced by a single solenoid. Aberrations in focal distance due to local perturbations, e.g. due to elevational changes on the plane to be imaged may best be accommodated by separate magnets.

For most demanding operation, fine adjustment for each mask level may be desirable. Expected variation in focal distance due to mechanical movement, temperature variations, etc. may be non-critical for less demanding processing, in which event fine focusing may be required only at startup each day.

FIG. 1 schematically represents an arrangement in which distance L is set to focus the image on resist 12 which is one cyclotron resonance period spaced from cathode 1. Use of a single-period spacing, corresponding with a distance of $\approx 0.2$ cm (under conditions as used in the Examples), is sufficient separation to reduce the likelihood of damage to the cathode. Still larger spacings, corresponding with a greater number of periods, perhaps with some degradation but still adequate resolution, are attainable. This permitted spacing constitutes one of the main advantages of the inventive approach relative to 1:1 x-ray.

Fields of from 2 to 5 tesla together with an accelerating voltage of from 2 kV to 100 kV provide for 500 Å resolution or better at the image plane. Acceleration within the noted range for current density of 1 to 10 micro amperes per square centimeter (1–10 $gA/cm^2$) yields a PMMA exposure time of tens of seconds.

For the most part, description has been in terms of instantaneous exposure from a 1:1 mask. The approach offers advantages both for scanning, e.g. step-and-repeat, and for image reduction, e.g. by use of a 4x–5x mask as employed in prospective e-beam and x-ray projection systems. Scanning of smaller sub-images relaxes requirements on field uniformity both for magnetic field and electric field. The prior art problem arising from use of fiducial marks based on back-scattering is avoided by use of x-ray-stimulated fluorescence. Markings, e.g. of $10^{-8}$ $cm^2$ area are adequate and avoid need to alter conditions optimized for delineation.

Figure 4:
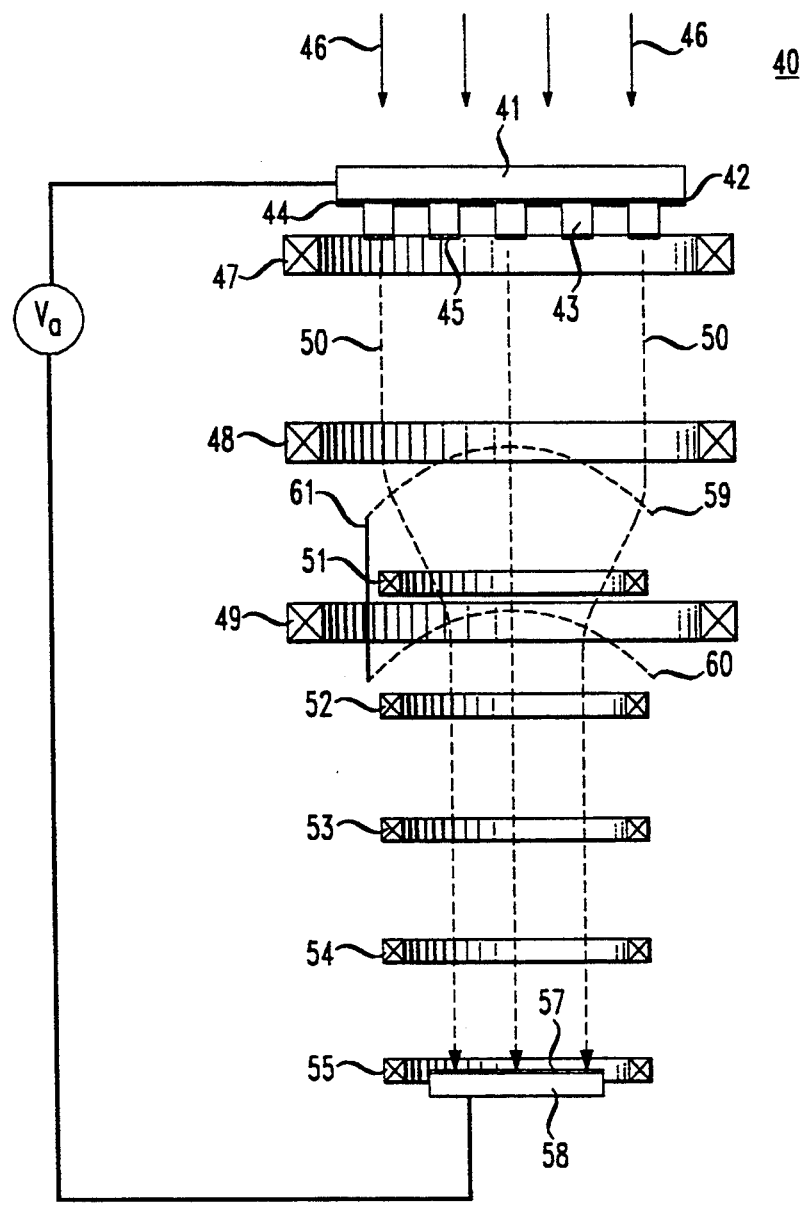
FIG. 4 is a diagrammatic representation of a structure for "funnel" projection—making using of changing magnetic field density to reduce the size of the projected image.

FIG. 4 is a schematic representation of a "funnel"—means for reducing/enlarging the projected image relative to the photocathode. It includes a photocathode 40, like that of FIG. 1, consisting of sapphire substrate 41 provided with chromium "glue" layer 42, tungsten blocking regions 43 and layered regions 44 and 45. UV radiation 46 excites regions 44, and is prevented from exciting regions 45 by regions 43.

A superconducting magnet of individual or series turns 47, 48 and 49 produces a uniform magnetic field of e.g. 2 tesla as represented by field lines 50. A second superconducting magnet composed of windings 51, 52, 53, 54 and 55 compresses the magnetic field to reduce its cross-sectional area, as now represented by field lines 56 and to increase its intensity perhaps to 10 tesla. The now-reduced image is projected on layer 57 supported by substrate 58. An applied voltage, $V_a$, e.g. of 50 kV, makes structure 40 cathodic relative to layer 57.

Most desirably, the direction of the accelerating field is parallel to the magnetic field lines 50 and 56. In the particular embodiment shown in FIG. 4, apparatus complexity is lessened by providing for a field-free region—for an electric field-free region—between electrically conducting gratings 59 and 60 which are interconnected by shunts 61. Other arrangements may use a separate accelerating field, of direction parallel to the magnetic field lines, between the gratings 59 and 60.

Figure 5:
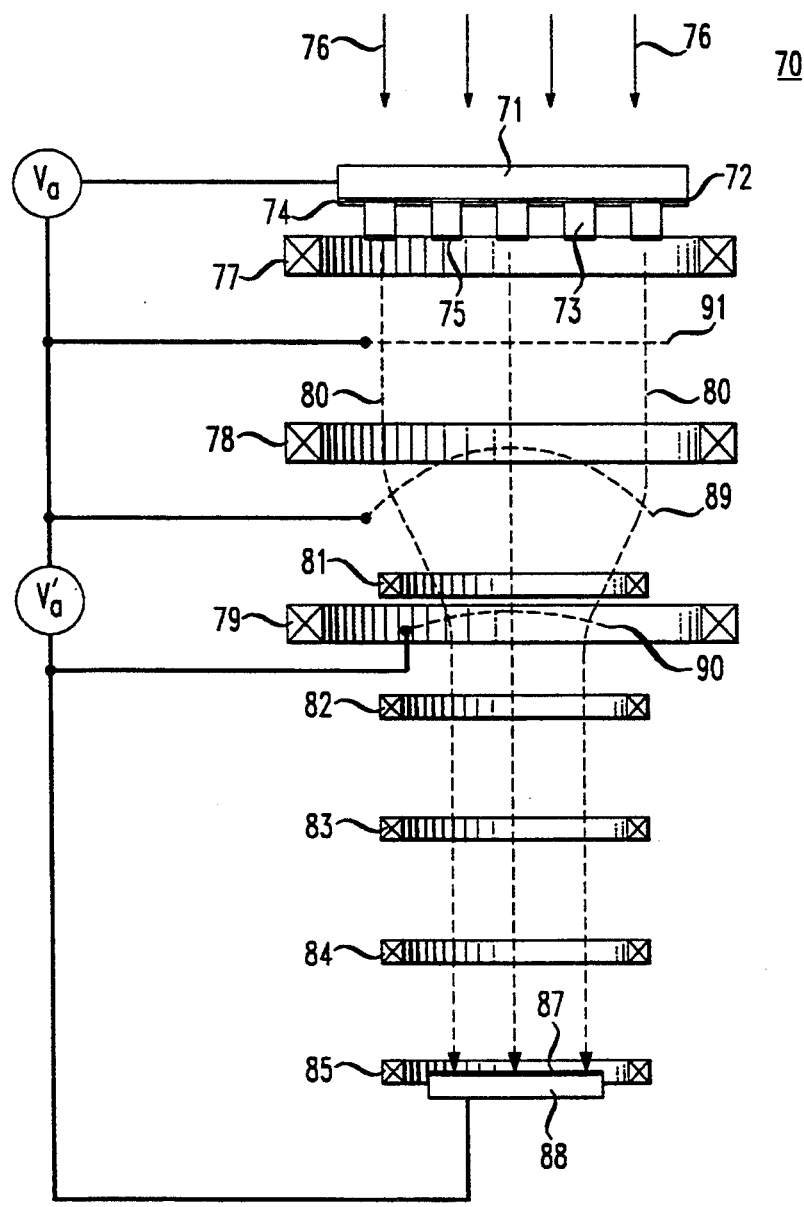
FIG. 5 is a diagrammatic representation of an alternative "funnel" structure.

FIG. 5 shows a "funnel" with provision for accommodating radially-dependent differences in electron path length in the region of magnetic field compression. For illustration purposes, the structure shown is identical to that of FIG. 4 with the exception of the accelerating grids 89, 90 and 91 and associated biasing. Elements numbers 70 and 71 through 88 are as described and serve the function as elements 40 and 41 through 58, respectively, of FIG. 4. Increased path length for extremal electrons is compensated by grids 89 and 90, so shaped as to be more closely spaced for greater distance from the central beam. This increases the accelerating field to offset increasing path length and improve flatness of the focal plane. In this illustration, field-free regions are maintained on either side of the compression region. Acceleration is restricted to regions 74–91 and 89–90 by voltage sources $V_a$ and $V'_a$, respectively.

The "funnel" approach is best suited to imaging electrons of near-equal energies. This is implicit in photocathodic imaging. Other forms of imaging may permit a narrow energy spread. The "funnel" may be useful in systems using absorption-transparency masks. It is likely not useful for scattering-non-scattering masking due to energy-reducing collisions which increase energy spread of the electrons.

EXAMPLES

Example 1

A thin-thin cathode is used for 1:1 delineation. The photo-emitting material is a 200 Å thick elemental Pt layer (of work function 5.6 eV). Blocking is by regions of 200 Å thick tungsten which oxidized to yield a 100 Å $W_2O_3$ layer. The work function of its oxide is 7.5 eV. The structure is similar to that of FIG. 2 and consists of a sapphire substrate of 0.1 μm thickness with a 100 Å Cr "glue" layer assuring adherence both of the Pt and W.

The backside of the cathode is irradiated by a krypton lamp. A 2 tesla magnetic field of $10^{-3}$ uniformity is applied. The accelerating field is 50 kV/cm or 25 kV for the 0.5 cm cathode-to-wafer separation. Patterning of 300 Å features in PMMA over a wafer area of 10 cm$^2$ requires from 5 to 10 seconds.

Example 2

A thick-thin structure as shown in FIG. 1 uses 200 Å thick Pt for photoemission and 1000 Å thick W for blocking—for UV absorption and/or reflection. A krypton lamp is used for excitation. Cathode-to-wafer separation is 1.5 cm. A magnetic field of 4 tesla and an accelerating voltage of 70 kV results in a PMMA print pattern of 200 Å features in 20 sec.

Example 3

The apparatus and conditions of Example 2, however, with cathode-to-wafer separation of 0.1 cm and by use of an accelerating voltage of 2 kV is used to pattern 1500 521 features on a PMMA-coated silicon wafer which is surface sensitized by exposure to silane. Exposure time of approximately twenty seconds is adequate.

Example 4

A cathode of the structure of FIG. 3 uses a 0.1 mm thick sapphire substrate bearing a 100 Å chromium layer and a final 100 Å platinum layer. The platinum is patterned by direct electron beam writing (by EBES) on PMMA followed by development. The pattern is transferred to the platinum layer by plasma etching to bare chromium. The composite surface is oxidized to produce a 100 Å layer of $Cr_2O_3$. The pattern-delineated photocathode is then used under the conditions of Example 2 to produce a 200 Å design rule pattern in PMMA.

We claim:

1. Method for device fabrication entailing pattern delineation of minimum feature size smaller than 0.25 μm, such delineation comprising irradiating a resist with patterned electron radiation, characterized in that such patterned radiation is yielded from a UV excited photocathode comprising free surface noble metal photoemissive material, in which said free surface is the surface of a photoemissive layer of a thickness of at least 100 Å, in that said radiation is focused on such resist as spaced an integral number of cyclotron resonance periods from the photocathode, and in which focusing and electron acceleration result from applied magnetic and electric fields.

2. Method of claim 1 in which said free surface is a surface of a layer which consists essentially of at least one element selected from the group consisting of elements numbers 44–47 and 75–79 inclusive of the Periodic Table according to Mendeleev.

3. Method of claim 2 in which such layer is unpatterned and in which emitted electron radiation is patterned by overlying blocking layered material presenting a free surface of work function higher than that of the emitting material.

4. Method of claim 3 in which the blocking layered material is noble metal of work function greater than that of the photoemissive material.

5. Method of claim 4 in which the blocking layered material comprises Pt.

6. Method of claim 2 in which said layer is unpatterned and in which emitted electron radiation is patterned by means of underlying blocking regions which absorb and/or reflect UV excitation energy.

7. Method of claim 6 in which the underlying blocking regions comprise tungsten.

8. Method of claim 2 in which the photoemissive layer is etch-patterned to reveal underlying material of greater work function.

9. Method of claim 1 in which the magnetic field is of intensity of at least 1 tesla.

10. Method of claim 9 in which said electric field is at least 10 kV/cm.

11. Method of claim 1 in which spacing between the image plane and the cathode corresponds with a single cyclotron resonance period.

12. Method of claim 1 in which pattern registration entails placement by means of fiducial marks which fluoresce upon being x-ray irradiated.

13. Method of claim 1 in which the magnetic field is increased in intensity and decreased in cross-section in the direction of electron travel whereby the image on the resist is reduced in size relative to the image on the photocathode.

14. Method of claim 1 in which the image is focused at the image plane by fine-tuning the magnetic field.

15. Method for device fabrication entailing at least one projection electron imaging step by projection from a photocathode, characterized in that a project image is changed in size relative to the image on the photocathode, in that electrons in transit are subjected to a magnetic field which, as measured in the direction orthogonal to transiting electrons, spatially changes in cross-section area at least once, and in that change in image size accompanies change in cross-section area of the field.

16. Method of claim 15 in which the cross-section area of the magnetic field is reduced, and in that reduction in area is accompanied by change in field intensity to result in reduced image size.

* * * * *